United States Patent [19]

Dalgleish et al.

[11] Patent Number: 5,548,643
[45] Date of Patent: Aug. 20, 1996

[54] WIRELESS BASE STATION-HAVING COOLING PASSAGES

[75] Inventors: Kevin L. Dalgleish; Sei S. Hoe; Gregory R. Reinhart, all of Calgary; Vincent E. Somoza; Rodney D. Pike, both of Nepean; John S. Moss, Ottawa; Michal Tencer, Nepean, all of Canada

[73] Assignee: Northern Telecom Limited, Montreal, Canada

[21] Appl. No.: 279,144

[22] Filed: Jul. 22, 1994

[51] Int. Cl.⁶ .................................................. H04M 1/00
[52] U.S. Cl. .......................... 379/429; 379/428; 379/433; 379/434
[58] Field of Search .................................... 379/428, 429, 379/433, 434–436; 455/89, 90; 361/690, 692, 693, 704, 814, 694, 688

[56] References Cited

U.S. PATENT DOCUMENTS

| | | | |
|---|---|---|---|
| 5,029,236 | 7/1991 | Yasuda et al. | 361/814 |
| 5,196,989 | 3/1993 | Zsolnay | 361/690 |
| 5,432,836 | 7/1995 | Jarrett | 379/435 |

FOREIGN PATENT DOCUMENTS

| | | | |
|---|---|---|---|
| 371708 | 6/1990 | European Pat. Off. | 379/433 |

Primary Examiner—Jeffery Hofsass
Assistant Examiner—Jack Chiang
Attorney, Agent, or Firm—R. J. Austin

[57] ABSTRACT

An outdoor wireless base station having a housing and a circuit pack extending upwards in the housing with electronic components extending into a forward air flow passage. The forward air flow passage is interconnected for air circulation with a rearward air flow passage and a heat conductive rear wall of the housing partly defines the rearward flow passage. Air in the forward air flow passage flows upwards and into the rearward air flow passage for heat removal through the rear wall. The cooling air flows downwards in the rearward air flow passage to return to the bottom of the forward air flow passage.

16 Claims, 10 Drawing Sheets

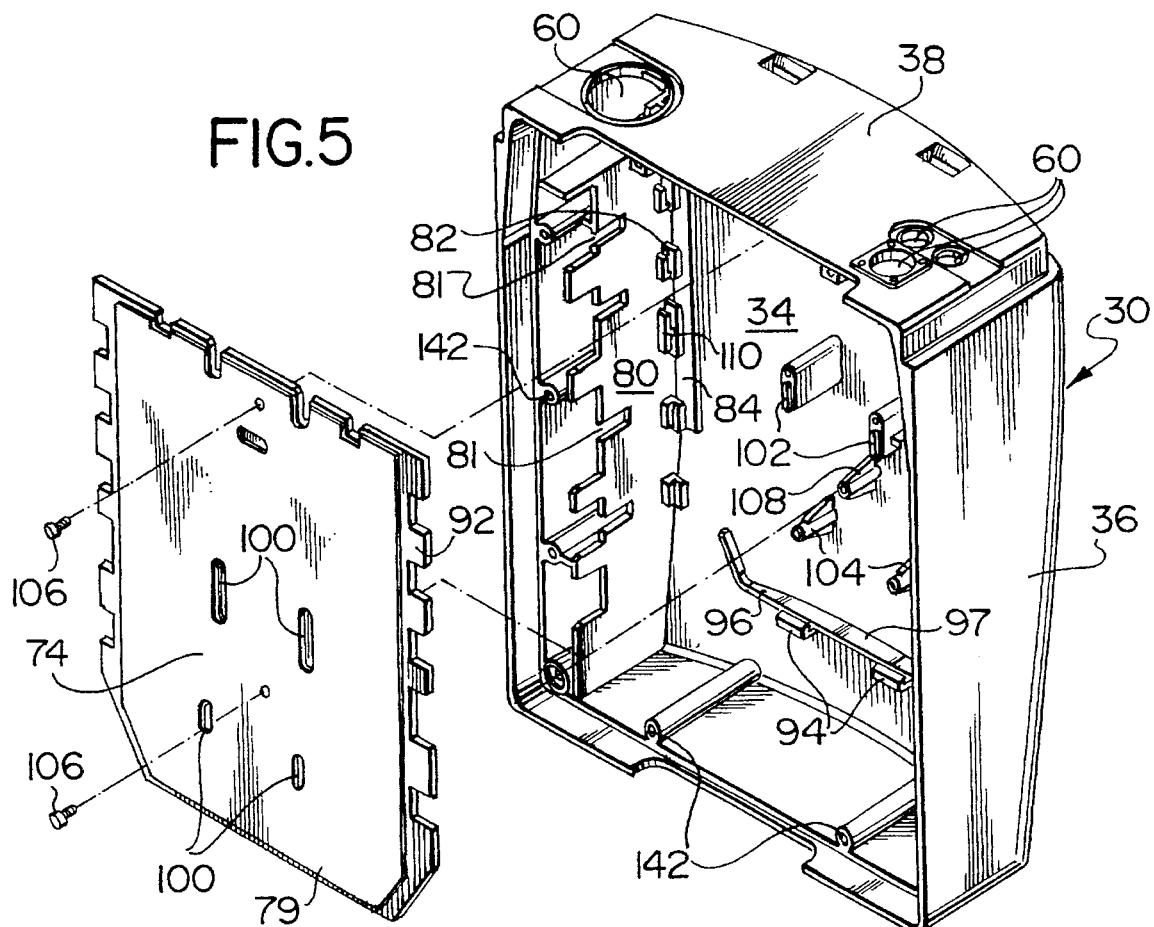
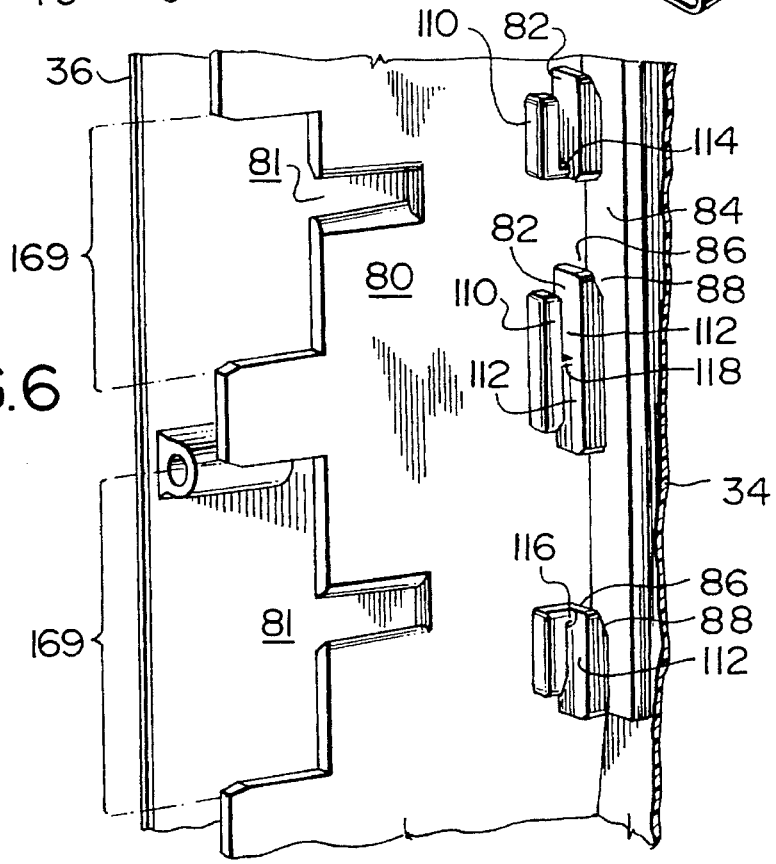

WIRELESS BASE STATION-HAVING COOLING PASSAGES

This invention relates to wireless base stations.

Wireless base stations are a recent development and are provided for the purpose of connecting cordless wireless telephone handsets into telecommunications circuits. For this purpose, the base stations comprise radio transmitters and receivers which are connected into the circuits, these transmitters and receivers being compatible with transmitters and receivers in the handsets for the transmission and reception of messages to and from the handsets within a certain limited operational distance. Base stations for use inside buildings meet requirements which are less stringent environmentally than those for use in the outside environment. Base stations for use outside buildings ideally need to be designed to withstand certain weather conditions. In the event of outside base stations being subjected to extremes of cold, heat or direct sunlight, it may be presupposed that suitable heating and/or cooling equipment should be included in the base stations, such equipment being operable, as the case may warrant, to maintain suitable temperatures for the equipment of the base stations. However, such heating or cooling equipment would require a power supply. In the event that the power supply to such equipment failed then this would undoubtedly result in destruction of most or all of the equipment within a base station. As telephone equipment is specifically designed for many long years of use and such requirements also desirably extend to the design of wireless base stations, it would be overly optimistic to expect heating or cooling equipment to be operable without breakdown for such extended periods. As a result it can only be expected that a majority of base stations would breakdown and need replacement or major repair upon failure of installed heating or cooling equipment. Such failures could occur a long time before the end of the expected useful life of the base stations. As may be seen, therefore, the use of cooling and/or heating equipment in outdoor base stations could not be expected to provide a commercially useful article and undue replacement expense, maintenance costs and inconvenience in sudden breakdown of apparatus would result.

In order to avoid the use of heating and cooling equipment in outdoor base stations, restrictions have necessarily been placed upon their location in an attempt to minimize the adverse weather conditions. For instance outside base stations have been located in positions where maximum shadow can be achieved against the effects of direct sunlight, especially in hot temperature zones. Protective overhangs have been useful for this purpose and have also combated, to a degree, against extreme cold or wind conditions. As may be seen, this heavily restricts the choice of sites for locations of base stations and in some cases, it may be extremely difficult to find a suitable location for a base station.

The present invention seeks to provide a wireless base station which may be used in and exposed to widely differing ambient temperature and weather conditions without suffering breakdown effects.

Accordingly, the present invention provides a wireless base station for outdoor use comprising a housing having a front wall and a heat control comprising a heat conductive rear wall, and a forward air flow passage interconnected for air circulation at upper and lower positions to a rearward air flow passage defined partly by the rear wall, and at least one circuit pack extending upwardly within the housing and having electronic components which extend into and, in operation, generate heat and heat the forward air flow passage whereby heat circulates between the forward and rearward air flow passages to distribute heat and maintain desired operating temperatures of the electronic components, the air being heated flowing upwards in the forward air flow passage and downwards in the rearward air flow passage as heat is transferred to the rear wall.

In constructions according to the invention, the sizes of the respective air flow passages depend upon certain parameters including the number of heat generating electronic components, the rate of heat generation, and the heat conductivity of the housing and of the rear wall and the relative face dimensions and area of the rear wall. Also, ambient temperature conditions in which the base station is to be used need to be taken into account. For instance, when used in hot ambient temperature conditions, the design may need to be such as to be efficient in heat transfer so as to maintain operating temperatures of the components below their upper limits. On the other hand, when used in cold climates, there will be a need to ensure that the heat generated is extracted at a slow rate to maintain the components at temperatures above the minimum operating temperatures.

In base stations according to the invention, the housing may be airtight. Alternatively, the housing may be formed at least partly from at least one material that is permeable to moisture. Such a construction is required in preferred arrangements in which a radio antenna is included within the base station and in which at least part of the housing is formed from a non-electrically conductive material such as a suitable plastic whereby the antenna is unshielded so as to enable communication with a cordless wireless telephone handset. In this preferred construction, moisture problems need to be minimized or avoided within the housing. These problems are overcome or minimized by including a humidity control device to provide a moisture balance between the inside and the outside of the housing and the heat control is operable to provide and maintain desired temperatures within the housing above ambient temperatures. With this arrangement and subject to design considerations, the air temperature within the wireless base station may be maintained to provide a temperature differential between inside and outside the housing so as to prevent condensation of any moisture in the air within the base station and thereby prevent deterioration of the electronic components. It has been found that ideally a temperature differential of around 10° C. between inside and outside temperatures is beneficial and can easily be maintained. It has been shown that in arrangements according to the invention a desired temperature differential, such as 10° C. is maintainable between inside and outside conditions for outside temperatures between −50° C. and +50° C. and also when the base station is subjected to direct sunlight in tropical zones for many hours during any particular day.

The designs of wireless base stations according to the invention vary according to the particular requirements of the base station. In one arrangement the at least one circuit pack may be disposed rearwardly of the forward flow passage with the heat generating electronic components extending in a forward direction into the forward flow passage and the forward flow passage interconnects with the rearward flow passage above and below the at least one circuit pack. Alternatively, the at least one circuit pack is disposed forwardly of the forward flow passage with the heat generating electronic components extending rearwardly into this flow passage. In this alternative, a vertical wall partition must be disposed between the forward and rearward air flow passages so as to separate them. In further alternative arrangements more than one circuit pack is included and, in this case, at least one circuit pack may be disposed rearwardly of the forward flow passage with another circuit pack disposed forwardly of this flow passage, both the circuit packs having electronic components extending into the forward flow passage.

As a further preferred requirement in controlling the temperature within the housing, a vertical chamber is provided behind the front wall, this vertical chamber being provided by an isolating member which provides in front of it an insulating air space which is substantially sealed and isolated from regions within the housing and rearwardly of the isolating member. In this preferred arrangement, equipment behind the isolating member is heat insulated to at least a degree from heat which accumulates in the front wall as a result of direct sunlight upon the front wall. Instead of the insulating air space, an insulating medium may be provided between the front wall and the isolating member, such as cellular foam insulation. It is also preferable to mount the antenna within the isolating air space and also preferably mounted upon the vertical isolating member. An electromagnetic radiation shield is therefore disposed behind the antenna and the circuit pack or packs of the base station.

According to a further aspect of the present invention there is provided a wireless base station for outside use comprising a housing having a mounting position for receiving a circuit pack within the housing, the circuit pack having a printed circuit board with opposite edges each formed with spaced apart projections and the housing at the mounting position provided with spaced apart guide elements for slidably receiving the projections at the opposite edges of the printed circuit board, the guide elements being spaced apart to allow for lateral movement of the projections between guide elements to permit interengagement of the projections with the guide elements and the guiding of the printed circuit board into its mounting position.

with the invention as defined immediately above, circuit packs are easily movable into their mounting positions while being guided without needing the circuit packs to be moved for a distance equivalent to their whole lengths along guide elements. Instead a minimal movement is required for this purpose thereby simplifying the mounting of the circuit packs within the housing. In a preferred arrangement which increases the modularity of the structure, at least two circuit packs are provided, each circuit pack having its own printed circuit board. These circuit packs have intermateable connectors for connecting one circuit pack with the other and mounting positions are provided for the two circuit packs. The guide elements of the mounting positions guide the circuit packs together with the connectors guided into connection one with the other. With this arrangement, one of the printed circuit boards may be removed for replacement purposes without affecting the position of the other printed circuit board. In a further preferred arrangement, the mounting positions are disposed so than when the circuit packs are in the mounting positions, the printed circuit boards are coplanar.

According to yet a further aspect of the present invention, there is provided an outdoor base station and support frame combination comprising a radio transmitting and receiving module comprising a first housing, and an interface module comprising a second housing and electrical connection apparatus for electrically connecting the transmitting and receiving module into a telecommunications circuit, the modules being detachably connectable together, the support frame and the modules each provided with guide elements for mounting each module upon the support frame and for guiding it into a mounting position, the guide elements on the support frame and on each module being spaced apart to allow for lateral movement of the guide elements of each module between guide elements of the support frame to permit interengagement of the guide elements and the guiding of each module into its mounting position, and securing means for securing each of the modules to the support frame.

The above base station and support frame combination of the invention provide an extremely convenient manner of mounting a base station upon a support wall. With the arrangement, it is possible to slide each module into its mounting position very easily and simply and with little effort as the module only requires a small degree of movement into its mounting position dictated by the movement required to interengage the spaced apart guide elements of the module with those of the frame. The frame may be disposed with the guide elements horizontally spaced or vertically spaced. In the case of the horizontal spaced guide elements each module needs to be moved in a horizontal direction to be mounted. However the vertical positioning of the guide elements is particularly useful in that it enables the interface module to be disposed directly above the radio transmitting and receiving module quite simply. Such a location helps to protect the radio transmitting and receiving module from adverse weather conditions such as rain or the influences of direct sunlight. With the vertical arrangement the interface module may be moved vertically downwards into its mounting position and may have a stop to limit the downward movement of the interface module, this stop preferably being with the interface module in its mounting position. This is especially convenient when mounting the base station in awkward or inconveniently high positions on walls in that the interface module is prevented from falling away from the frame before the securing means is placed in position. Conveniently also, the transmitting and receiving module is movable vertically upwards into its own mounting position so as to cause it to approach the interface module. Again a stop is preferably provided to prevent downward movement of the transmitting and receiving module beyond a certain limit for safety purposes.

One embodiment of the invention will now be described, by way of example, with reference to the accompanying drawings, in which:

FIG. 5 is an exploded view of part of a front of a radio transmitting and receiving module of the base station as shown from the rear;

FIG. 6 is a greatly enlarged view in the same direction as FIG. 5 to show a detail within the radio transmitting and receiving module;

Figure 1:
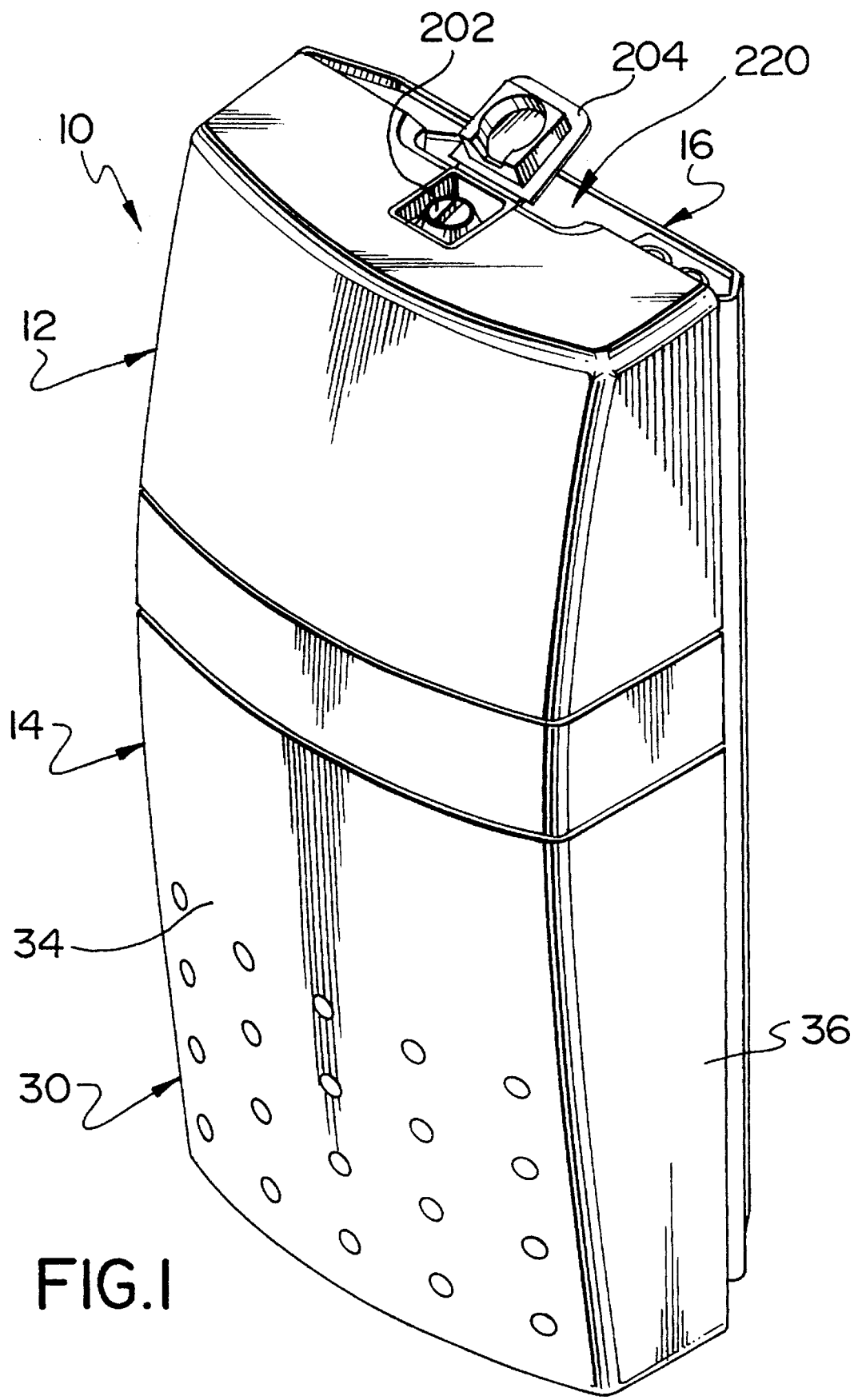
FIG. 1 is an isometric view of a base station according to the embodiment.

In the embodiment as shown by FIG. 1, a base station 10 for outdoor use comprises an upper interface module 12 and a lower radio transmitting and receiving module 14. The base station is to be assembled onto a support frame 16 as shown in FIG. 1 and as will be further described.

Figure 2:
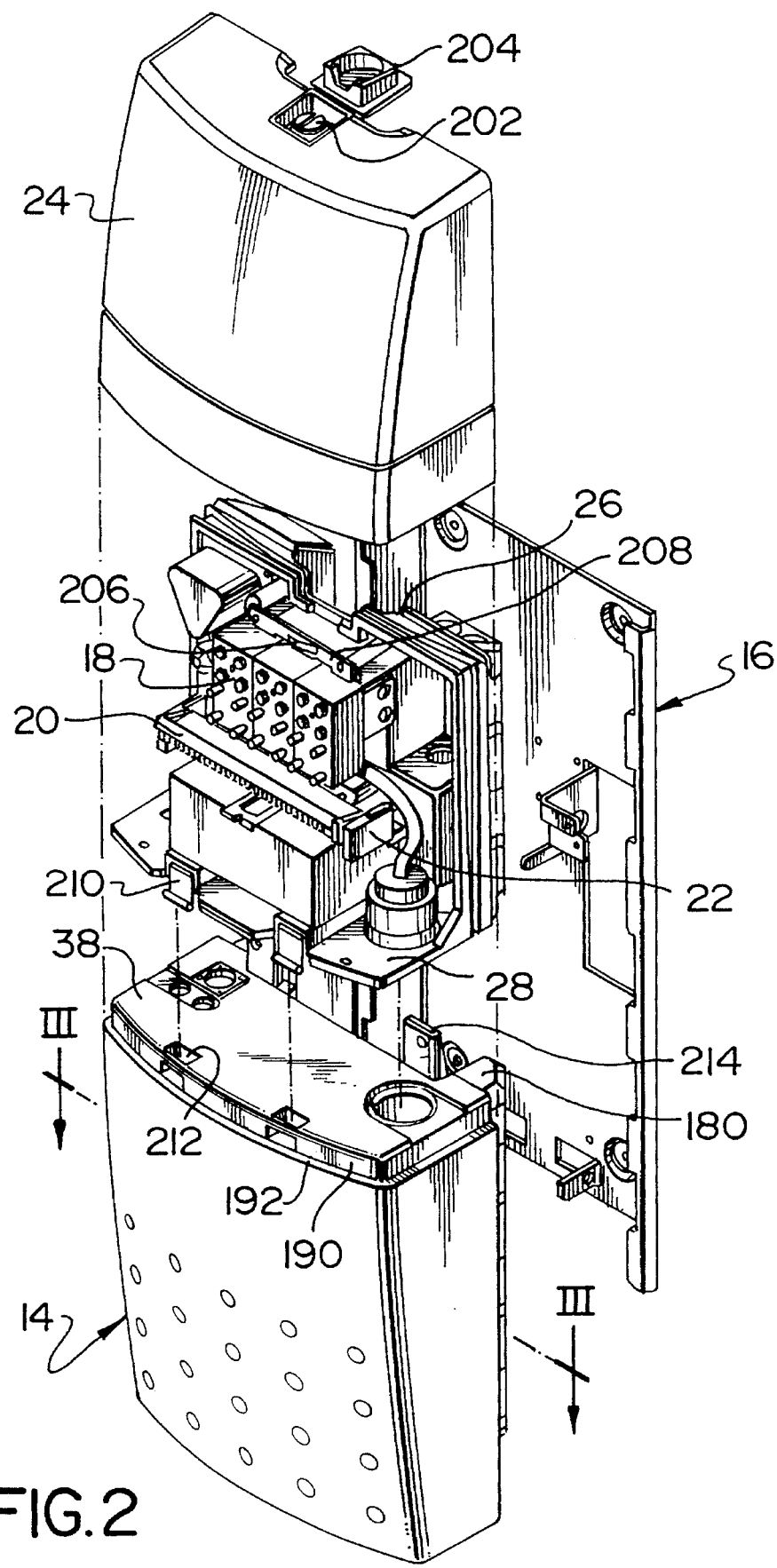
FIG. 2 is a view similar to FIG. 1, on smaller scale, and showing the base station in semi-exploded condition with a support frame included.

The interface module 12 is provided for connecting the radio transmitting and receiving module with a telecommunications circuit. For this purpose, as shown by FIG. 2, the interface module is provided with a plurality (namely three) overvoltage and overcurrent protectors 18 which are interposed between an incoming cable (not shown) of the telecommunications circuit and electrical wiring extending to a rear of an elongate connector 20 mounted in a support 22. Wiring, not shown, then extends from the front of the connector 20 to equipment in the lower module 14. The interface module 12 further comprises a housing which in turn comprises a cover 24 which includes a front, sides and top of the housing, the housing also including a rear housing part 26 and a base 28. The rear housing part 26 and the base 28 carry between them the overvoltage and overcurrent protectors 18, the connector 22, and other ancillary equipment. The connector 22 is conveniently constructed in accordance with a connector described in U.S. Pat. No. 4,295,703 granted Oct. 20, 1981 in the name of B. T. Osborne. This particular connector is an elongate article having an outer insulation of plastics material which houses a plurality of conductors extending from side-to-side of the material, the conductors terminating at each side in electrical insulation displacement terminals for accepting electrical wire, the terminals at each side being disposed in series from one end of the connector to the other. Thus the incoming cable wires connected to the rear terminals of the connector 20 are electrically connected by the conductors to the wires extending from the front terminals and connected to the equipment in the transmitting and receiving module 14. The cover 24 is assembled to the rear housing part 26 and the base 28 with the use of seals (not shown) to hermetically seal the housing around the inside components.

The radio transmitting and receiving module 14 comprises a housing consisting of a front housing portion 30 (FIGS. 1, 3 and 4) and a rear housing portion 32. The front housing portion includes a front wall 34, side walls 36, and top and bottom walls 38 and 40. The module 14 includes an inside antenna (to be described) for cooperation with a cordless telephone handset. Because of this, the base station requires a non-electrically conductive housing so as to prevent a shield being formed between a wireless telephone handset and the antenna. In practical terms, as will be discussed, a plastic housing is thus required and this produces certain problems with regard to internal humidity and certain requirements are necessary in the embodiment to resolve these problems. In addition, the apparatus as will be explained, is operable in extreme adverse weather conditions, i.e. between temperatures of approximately −50° C. and +50° C. and may be in direct sunlight for extensive daily periods without the internal electronics suffering from damage caused by either heat or cold. Bearing all of the above requirements in mind, the module 14 is constructed in the following manner.

Figure 3:
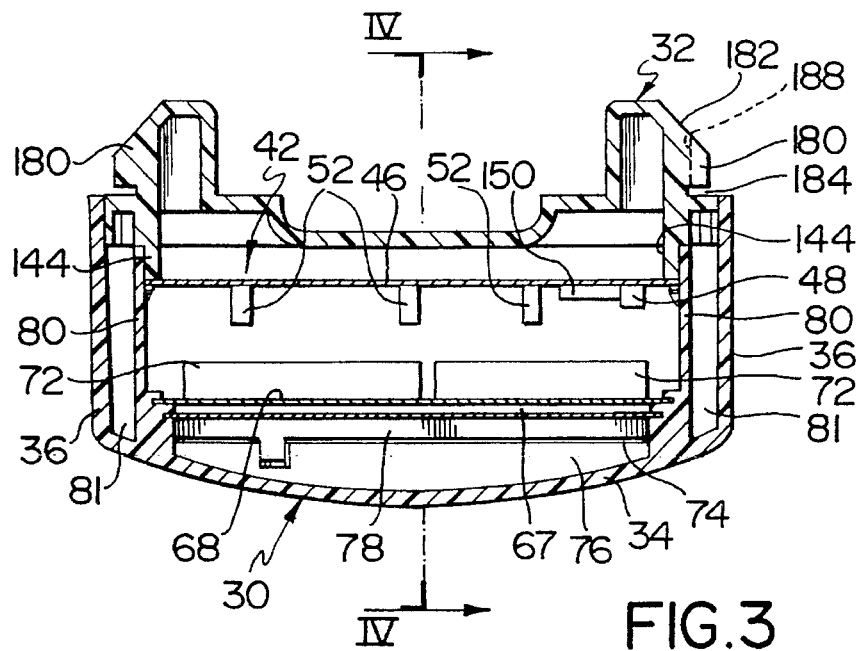
FIG. 3 is a diagrammatic cross-sectional view through the base station taken along line III—III in FIG. 2 and to much larger scale.
Figure 4:
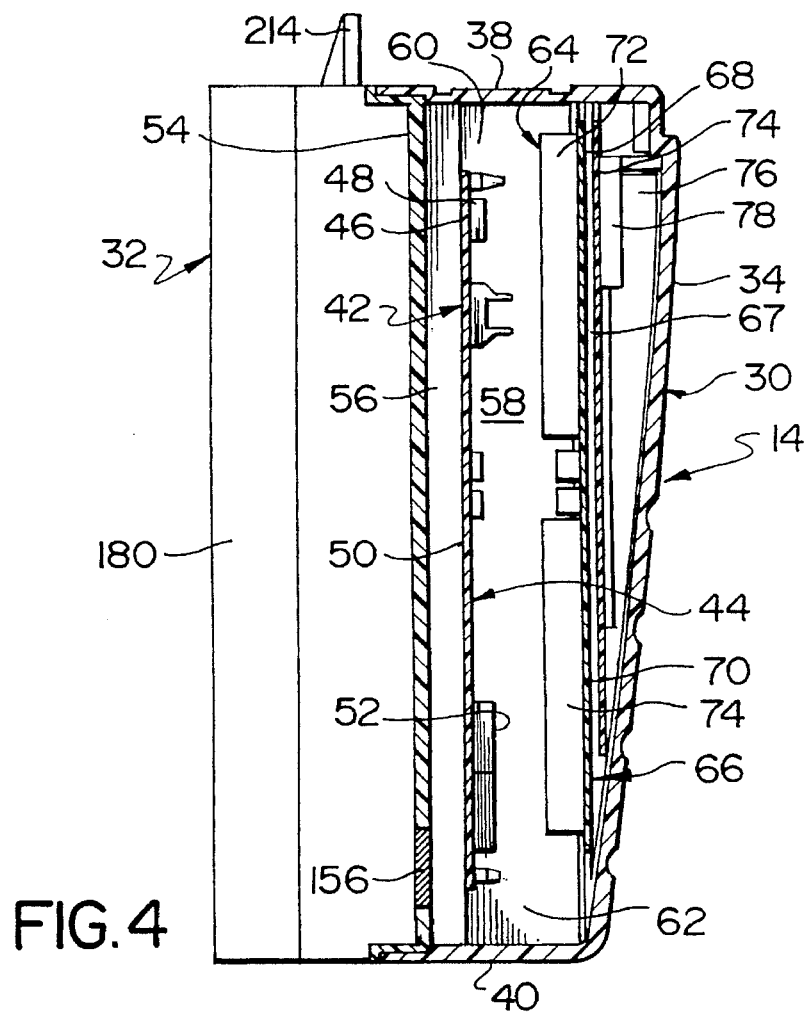
FIG. 4 is a diagrammatic cross-sectional view through the base station and taken along line IV—IV in FIG. 3.

As shown diagrammatically in FIGS. 3 and 4 within the rear housing portion 32 are disposed two circuit packs 42 and 44, circuit pack 42 providing a network interface which interconnects with the electrical equipment in interface module 12 and has a printed circuit board 46 with electronic components 48 mounted thereon. The circuit pack 44 is for power supply and has a printed circuit board 50 with components 52 mounted thereon. These two circuit packs are mounted with their circuit boards 46 and 50 vertically disposed and vertically in alignment one above another as shown by FIG. 4. In this position, the circuit packs 42 and 44 are disposed a spaced distance from a rear wall 54 of the rear housing portion 32 so as to provide a rearward vertical air flow passage 56. In front of the circuit packs 42 and 44 is a forward air flow passage 58. The rearward and forward air flow passages 56 and 58 are interconnected at the top by space 60 between the top edge of the printed circuit board 46 and the top wall 38 of the housing 30, and at the bottom by a space 62 between the lower edge of the printed circuit board 50 and the bottom wall 40 of the housing. The forward air flow passage 58 is defined at its front by an upper circuit pack 64 and a lower circuit pack 66 mounted into the front housing portion 30. The circuit packs 64 and 66 have respectively, printed circuit boards 68 and 70 carrying electrical components shielded with electromagnetic shields 72 and 74 as shown. As shown in FIG. 4, the printed circuit boards 68 and 70 extend vertically and are vertically aligned. The electronic components on the boards 68 and 70 extend rearwardly with the electromagnetic shields 72 and 74 extending into the forward air flow passage 58 as shown. The circuit pack 64 provides for radio transmission and reception and circuit pack 66 is a controller for the operation of pack 64. The circuit pack 66 generates more heat in use than the circuit pack 68 and for reasons of heat transference into the forward flow passage 58, is disposed lower than the circuit pack 64 for more heat exchange efficiency into circulating cooling air in the flow passage 58 during use. Forwardly of the circuit packs 64 and 66 there is a small gap 67 at the other side of which is an antenna printed circuit board 14. The printed circuit board 74 defines with the front wall 34 an isolating air space 76 which is provided for the purpose of insulating the interior of the module 14 behind the printed circuit board 74 from heat which is radiated into the front wall 34 by direct sunlight in tropical conditions. The insulation effect is somewhat assisted by the fact that the front wall 34 slopes downwardly and rearwardly as shown in FIG. 4. The slope faces the front wall away from any direct confrontation with the sun position during the heat of the day and minimizes the heat consumption into the wall directly from sun radiation. The printed circuit board 74 is not directly affected by heat and this circuit board carries a radio antenna 78 which projects into the insulating air space 76.

The circuit board 74 has at least one ground conductor plate 79 (FIG. 5) which extends over all or substantially over all of the area of the circuit board 74 and acts in addition to its ground capacity, as an electromagnetic shield member for shielding the electronic components of the circuit packs 42, 50, 64 and 66 from the antenna 78. In addition to this, the ground conductor plate of the printed circuit board 74 is provided to dissipate heat in the plate across the plate to maximize heat distribution into the board. Similar ground conductor plates are included in the circuit boards 46, 50, 68 and 70. These plates act in some electromagnetic shielding capacity while also acting to distribute heat away from hot spots in the boards so that a more uniform temperature is created throughout each board and cold spots are thereby also avoided. For this purpose it may be necessary to design each ground plate with the required thickness of material for heat conducting purposes to achieve the desired object. The elimination of cold spots prevents any condensation of moisture in otherwise cold spot areas upon the electronic equipment.

Figure 7:
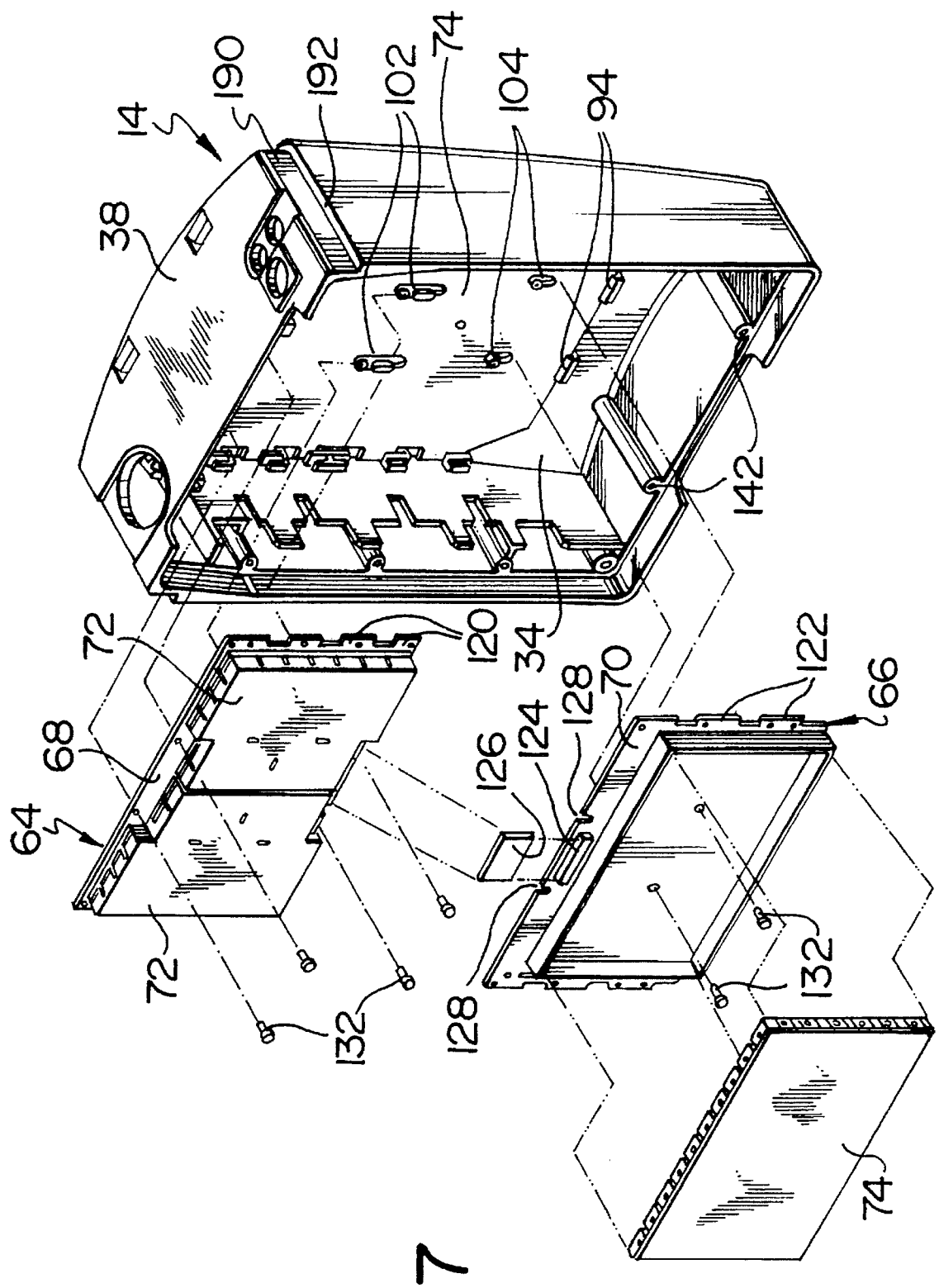
FIG. 7 is an exploded view similar to FIG. 5 and showing further components of the radio transmitting and receiving module.

FIG. 5 shows a rear isometric view of the front housing portion 30 and the printed circuit board 74 in exploded relationship. To assemble the printed circuit board 74 into the front housing portion 30, the front housing portion is provided inside, and behind each side of the front wall 34, with spaced apart guide elements to define spaced apart guide slots for receiving projections on the printed circuit board 74 to allow the printed circuit board to be slid into a mounting position. As shown in greater detail in the enlarged view of FIG. 6, an internal wall 80 is disposed inwardly of each side wall 36 and is spaced slightly from it to provide air insulation spaces 81 between the walls 80 and 36. The distance between each wall 36 and its corresponding wall 80 extremely small so as to prevent or restrict air circulation. At the forward end of each of the internal walls 80 are disposed a plurality of guide elements in the form of projections 82 which extend a short lateral distance across the module 14 and are spaced from a planar surface 84 formed upon the front wall to provide the guide slots 86 between the projections 82 and the surface 84 for the printed circuit board 74. Each of the guide slots 86 has an upper widened guide entrance provided by an inclined surface 88 of the associated projection 82. The projections 82 are spaced apart to allow for lateral movement of projections 92 at opposite edges of the printed circuit board 74 between the projections 82 and permit interengagement of the projections 92 into the slots 86. For electromagnetic shielding, effects (referred to above) the ground plate 79 extends extremely close to all edges of the board 74, i.e. about 0.20 inches from the top and bottom edges and about 0.20 inches from the bases of the projections 92. These projections 92 as shown by FIG. 5 are provided as planar extensions to the board material and are sized so as to move laterally through meshing positions with the projections 82. Downward movement of the printed circuit board 74 in the guide slots 86 moves it into a mounting position (FIG. 7). When in the mounting position, the printed circuit board 74 is moved downwardly to abut against support projections 94 extending rearwardly from the front wall 34 (FIG. 7). In this position, the printed circuit board 74 has its forward face fitting closely against the planar surface 84 at each side of the front wall 34 and also against a rear facing planar surface 96 (FIG. 5) of a rearwardly facing generally horizontal rib 97 of the front wall 34. AS may be seen, therefore, only small spaces of negligible area exist between the printed circuit board 74 and the front wall 34, these spaces mainly extending from the lower end of the surface 84 to the surface 96 at each side and also provided by a slight gap at the top end of the printed circuit board 74. As a result, the insulation air space 76 is created which allows for negligible air flow and thus inhibits conduction of heat from the front wall 34 into the printed circuit board 74.

It will be noted (FIG. 5) that the circuit board 74 is formed with slots 100 for accommodating upper posts 102 and lower posts 104 extending rearwardly from the front wall. These posts extend through the board 74 as shown in FIG. 7 and are formed with bores for accepting screws for attachment of the circuit packs 64 and 66 which is the following assembly step to be described. The printed circuit board 74 is secured in position by securing means in the form of two screws 106 (FIG. 5) which pass through the board and into securing posts 108, only the lower of one of which is shown in FIG. 5, the upper one being hidden by the top wall 38.

As shown by FIG. 7, each of the circuit packs 64 and 66 is assembled into the front housing portion 30 in a similar manner to that of the printed circuit board 74. For this purpose, and again with reference to FIG. 6, further projections 110 extend laterally from each internal wall 80 and are spaced slightly from the projections 82 so as to provide a second series of guide slots 112 spaced from the guide slots 86. Each of the upper guide slots 112 is terminated at its lower end by a stop 114 which extends between the associated projections 110 and 82. Each of the lower guide slots 112 has upper stops 116 provided in similar manner. A center projection 82 and its corresponding projection 110 has a stop 118 which lies intermediate their ends so as to provide upper and lower guide slots 112. As shown by FIG. 7, the printed circuit boards 68 and 70 of the two circuit packs 64 and 66 are provided respectively with projections 120 and 122 which form planar extensions of the printed circuit boards at each side. With regard to the circuit pack 64, the projections 120 are designed to fit between succeeding projections 110 as the circuit pack is offered into its mounting position. This circuit pack is then moved downwards by downward movement of the projections 120 into the guide slots 112 and this downward movement is terminated by engagement of one or all of the projections 120 with a corresponding stop 114 or 118. Conversely, the circuit pack 66 is offered into its mounting position by acceptance of the projections between the lower projections 110 and then upward movement of the circuit pack into the corresponding guide slots 112 until the upper edges of the projections 122 engage one or other of the stops 116 and 118. It is worthy of note that the posts 102 are elongate in a vertical direction and lie towards the center of the front wall 34, i.e. one at each side of intermateable connectors 124 and 126 of the printed circuit boards 68 and 70. These posts 102 provide registration means for the boards 68 and 70 and align the connectors 124 and 126 as the circuit packs 64 and 66 move into their mounting positions. For this purpose, the posts are slidably received within edge slots 128 of the two boards 68 and 70. The printed circuit boards 68 and 70 are then secured in position by the use of securing screws 132 into the posts 102 and 104 and into other securing positions in the front wall if desired. For this purpose and as shown by FIG. 7, it may be necessary for the shields 72 and 74 to be removed from the printed circuit boards for mounting purposes. Alternatively, the design of the circuit packs is such than any electromagnetic shielding does not obscure the mounting holes for the screws and the complete assembly of the circuit packs with the shielding is possible before assembling the circuit packs into the module 14.

As may be seen therefore with the circuit packs 64 and 66 assembled in the above manner, removal of either of the circuit packs is possible for replacement purposes followed by easy alignment of the packs for connection of their intermateable connectors.

Figure 8:
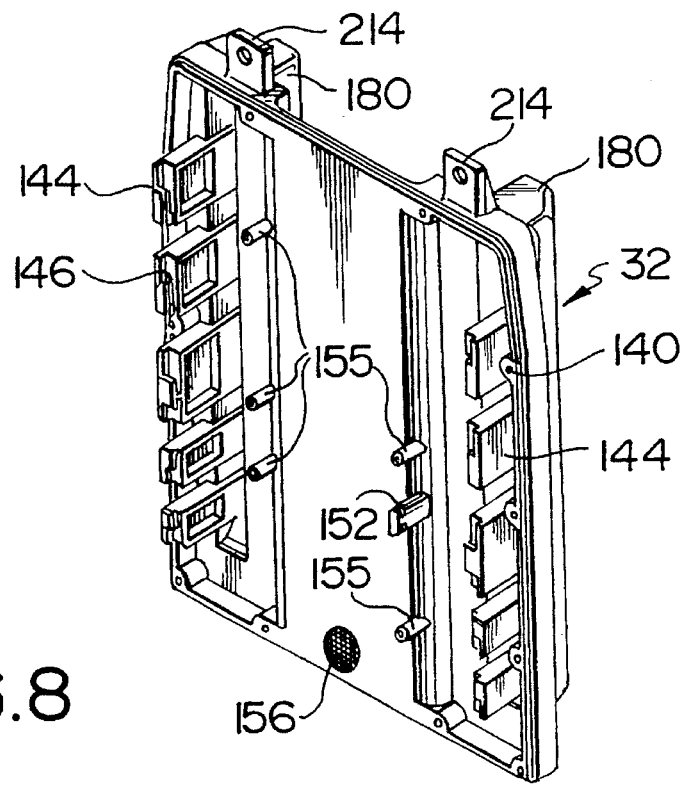
FIG. 8 is an isometric view of a rear housing part of the radio transmitting and receiving module.
Figure 9:
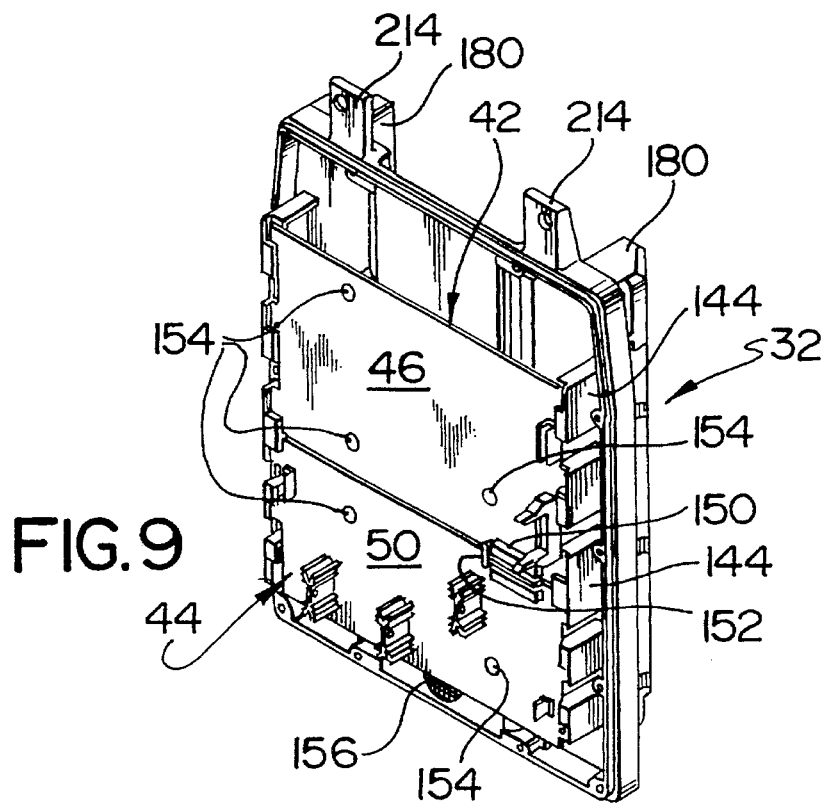
FIG. 9 is a view similar to FIG. 8 of the rear housing part and showing components fitted to it.

FIG. 8 shows an isometric front view of the rear housing portion 32 of the housing 30. This housing portion 32 is assembled to the rear edges of the side, top and bottom walls 36, 38 and 40 of the front housing portion by reception of screws (not shown) through aligned holes 140 in the rear housing portion 32 and holes 142 (FIG. 7) in the front housing portion. As indicated, the rear housing portion 32 carries the circuit packs 42 and 44. For this purpose at each side of the rear housing part 32 is provided a vertically aligned series of forwardly projecting posts 144 at forward edges of which are provided vertically aligned and spaced guide slots 146. The printed circuit boards 46 and 50 of the two circuit packs 42 and 44 have edge projections similar to the edge projections 120 and 122 (previously described) and are assembled into the guide slots 146 in a manner similar to the assembly of the circuit packs 64 and 66 into the front housing portion. Thus, in a final assembled position as shown by FIG. 9, the circuit packs 42 and 44 are as shown in the rear housing part 32 with intermateable connectors 150 of the two circuit packs aligned and connected together, alignment being provided by a registration post 152 extending forwardly of the rear housing part for registration within corresponding slots in opposed edges of the printed circuit boards 46 and 50. Screws 154 pass through the printed circuit boards 46 and 50 into posts 155 of the rear circuit part.

The inclusion of the antenna within the module 14 requires the housing to be formed from a non-electrical conducting material so that no shielding effect is created between the antenna and a cordless wireless telephone handset with which it is intended to communicate. For this reason, the front wall 34 of the module housing and, in practice, the whole of the housing, i.e. front and rear housing portions 30 and 32, is formed from a plastics material. This material is a glass-filled polycarbonate of molded construction which has a good flexibility, high impact resistance and is extremely rigid. While this material is not instrumental in preventing communication between the antenna and the handset, it has a certain permeability factor which enables build-up of moisture in the air contained within the housing. Steps must therefore be taken to remove the moisture from this enclosed air and also to provide moisture balance between the inside and the outside of the housing so as to minimize or cancel any tendency for condensation accumulation upon electronic parts within the housing and which may be deleteriously affected thereby. For this purpose a humidity control device 156 is disposed at the lower end of the rear housing portion 32 (FIGS. 4, 8 and 9), this device including a wall of expanded Teflon having a pore size of up to 3 microns for the purpose of equalizing humidity on the two sides of the Teflon wall. For this purpose expanded Teflon available under the trade name Goretex has been found to be completely suitable. It should be noted, that with the device 156 in this position it is at the lower end or lower end portion of the rearward air flow passage 56.

Figure 10:
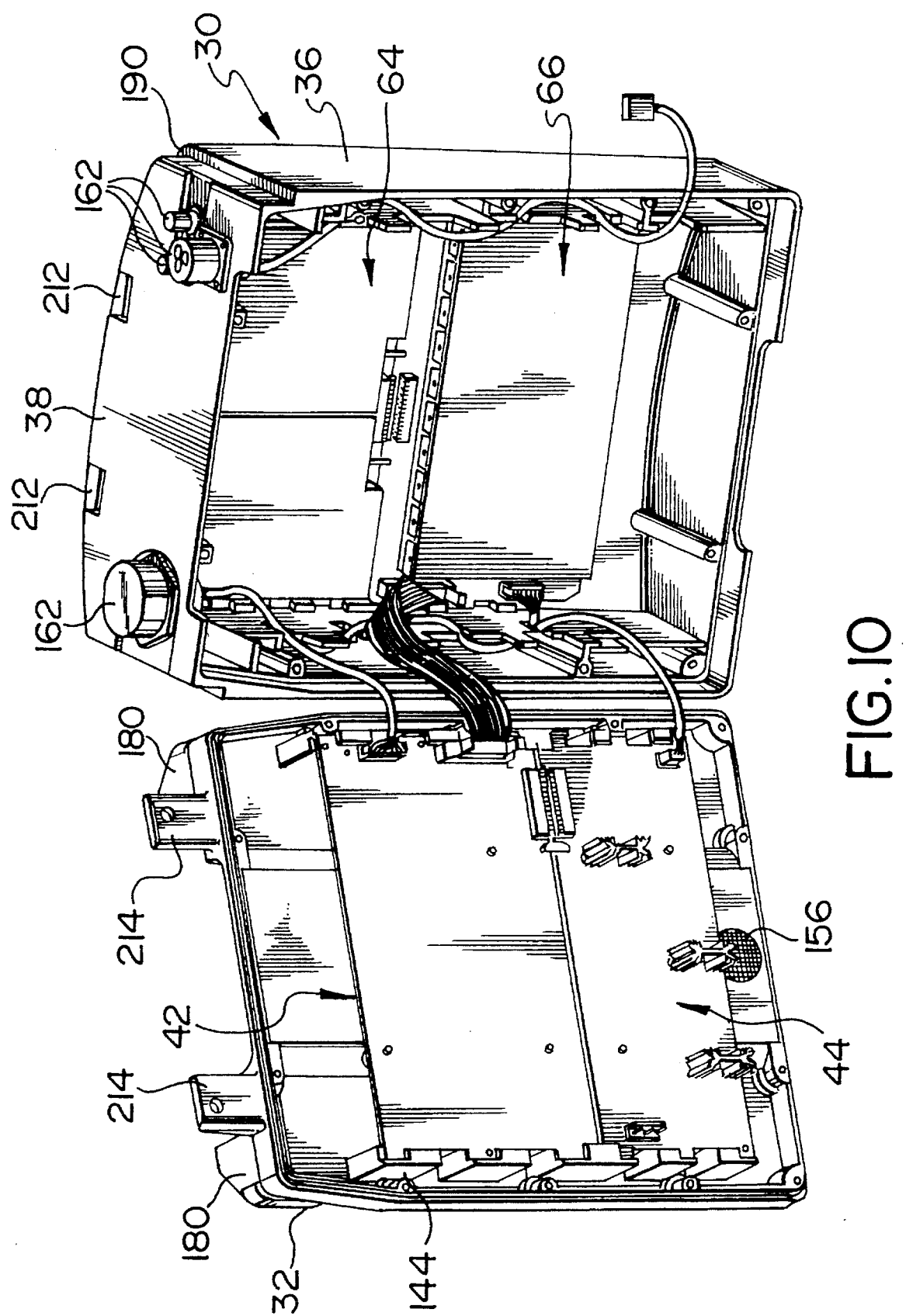
FIG. 10 is an isometric view of the radio transmitting and receiving module with the rear and front housing parts separated and components fitted.

The assembly of all the components into the forward and rear housing pares of the module 14 together with electrical wiring connections between these parts is shown in FIG. 10 which illustrates the mounting positions for all of the circuit packs. As shown, the top wall 38 is provided with openings 60 (FIG. 5) for acceptance of connectors 162 or cables for connection to the equipment in the module 12. In the assembled condition, the posts 144 of the rear housing portion 32 project into spaces 169 (FIG. 6) in the internal wall 80 substantially to close the spaces 81 except for small gaps, thereby restricting air circulation in these spaces and providing an insulating effect.

Figures 11, 13:
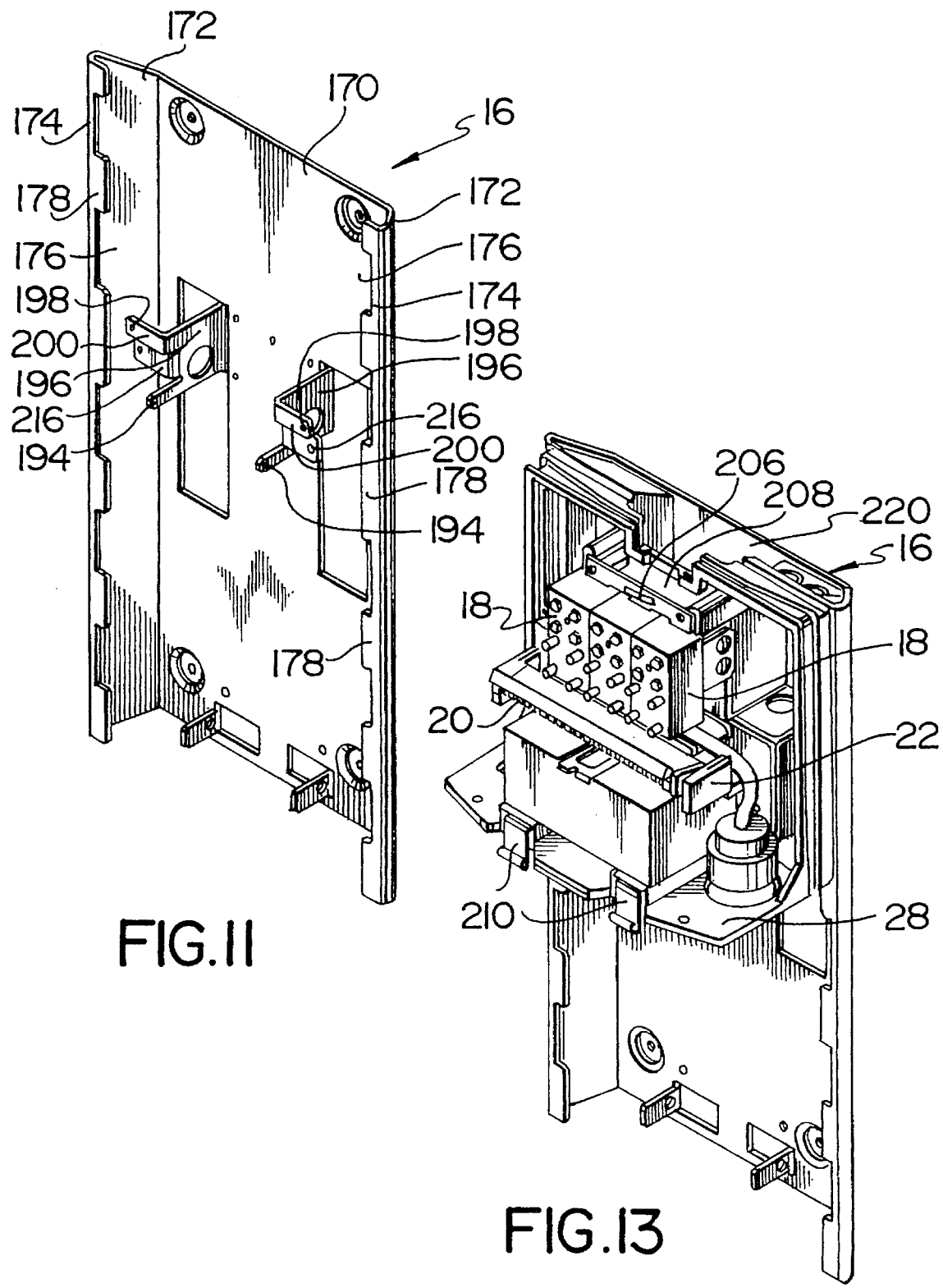
FIG. 11 is an isometric view of the support frame from the base station.
FIG. 13 is an isometric view of part of an interface module of the base station assembled to the support frame.
Figure 12:
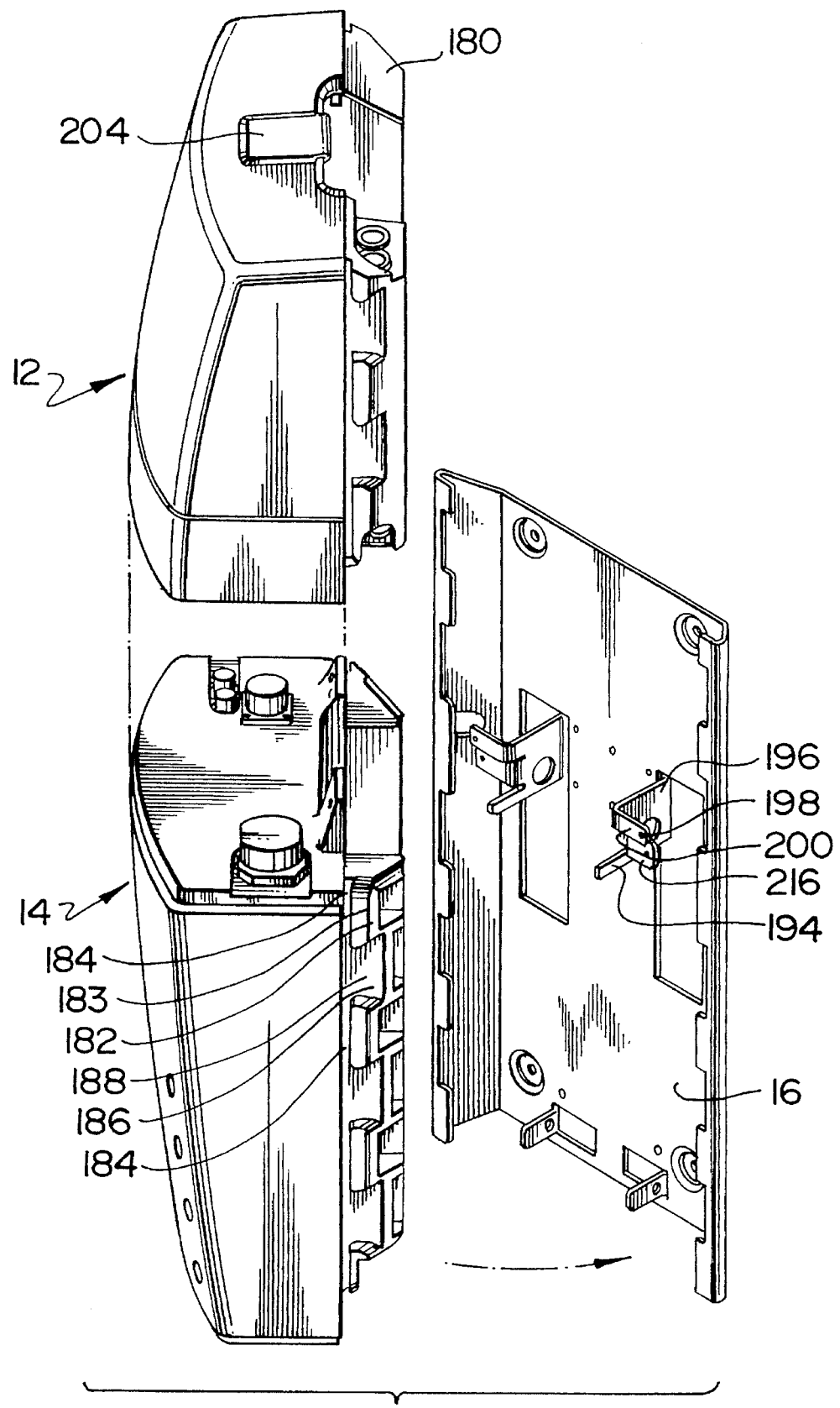
FIG. 12 is an exploded isometric view showing the base station and support frame prior to assembly.

As shown by FIG. 11, the support frame 16 for mounting the base station 10 upon a wall comprises a planar base plate 170 having at each side an inclined planar edge extension 172 extending at an angle to base plate 170 and terminating in an inward turn flange 174. This flange 174 at each side, provides a vertical module retaining guide comprising guide elements which are projections 178 of the flange 174, the guide elements defining slots 176 therebetween. As shown by FIGS. 2, 3, 4 and 12, the rear housing portion 32 of the module 14 has two rearward extensions 180 which extend vertically one at each side of and rearwardly of the cover portion 32. Each of these extensions 180 is tapered rearwardly by a sloping outer edge 182 and provides a series of in-line guide elements 183. Spaced apart aligned guide slots 184 are defined between the guide elements 183 and a rear surface at outer edge regions of the rear housing portion 32. As shown by FIG. 12, openings 186 are provided between the guide elements 183, the openings 186 extending laterally inwards into the projections and having base surfaces 188 (FIG. 3) coplanar with and merging with the bases of the guide slots 184. The guide elements 183 and projections 178 are relatively disposed to enable them to mesh together with the projections 178 passing through the slots 186 to align the projections with the guide slots 184. The projections 178 are slidable along the slots 184. Rear housing part 26 of the module 12 is similarly provided with guide slots 184 for the same purpose.

It is intended that in the assembled condition of the two modules, the interface module 12 lies directly above and contacts the radio transmitting and receiving module 14 as this protects the module 14, to some degree, from ambient weather conditions such as rain, fog or snow or even from direct heat radiation from the sun into the top wall 38 of the housing of the module 14. In addition to this, all of the surfaces of at least module 14 are designed so as not to extend perfectly horizontally in installed condition. For this purpose, parts of the upper surface of the top wall 38 slope in appropriate directions for moisture or condensation run-off and as may be seen, the top region of the housing of the module 14 has a step 190 extending into the side walls 36 and the front wall 34 and into which the front cover 24 of the module 12 fits so as to resist any tendency for moisture or rain to either reach or accumulate upon the top surface of the top wall 38. Further, upwardly facing surfaces 192 which provide lower extremes of the stop 190 are sloped downwardly and outwardly for moisture run-off.

It is intended that the upper module 12 should be assembled into the support frame independently of the module 14 and such as to enable the module 12 to be disposed in position without subsequent interference to equipment housed within module 12 upon addition of or removal of the module 14. Hence, it is possible for a telecommunications company to assemble the module 12 into position and make all the necessary electrical connections within that module to an incoming cable preparatory to the module being connected by the appropriate wires and cabling to the module 14 when a customer is desirous of using the base station. It is unnecessary therefore for the customer to interfere with the connections and equipment which have previously been installed by the telecommunications company within the module 12.

Figure 14:
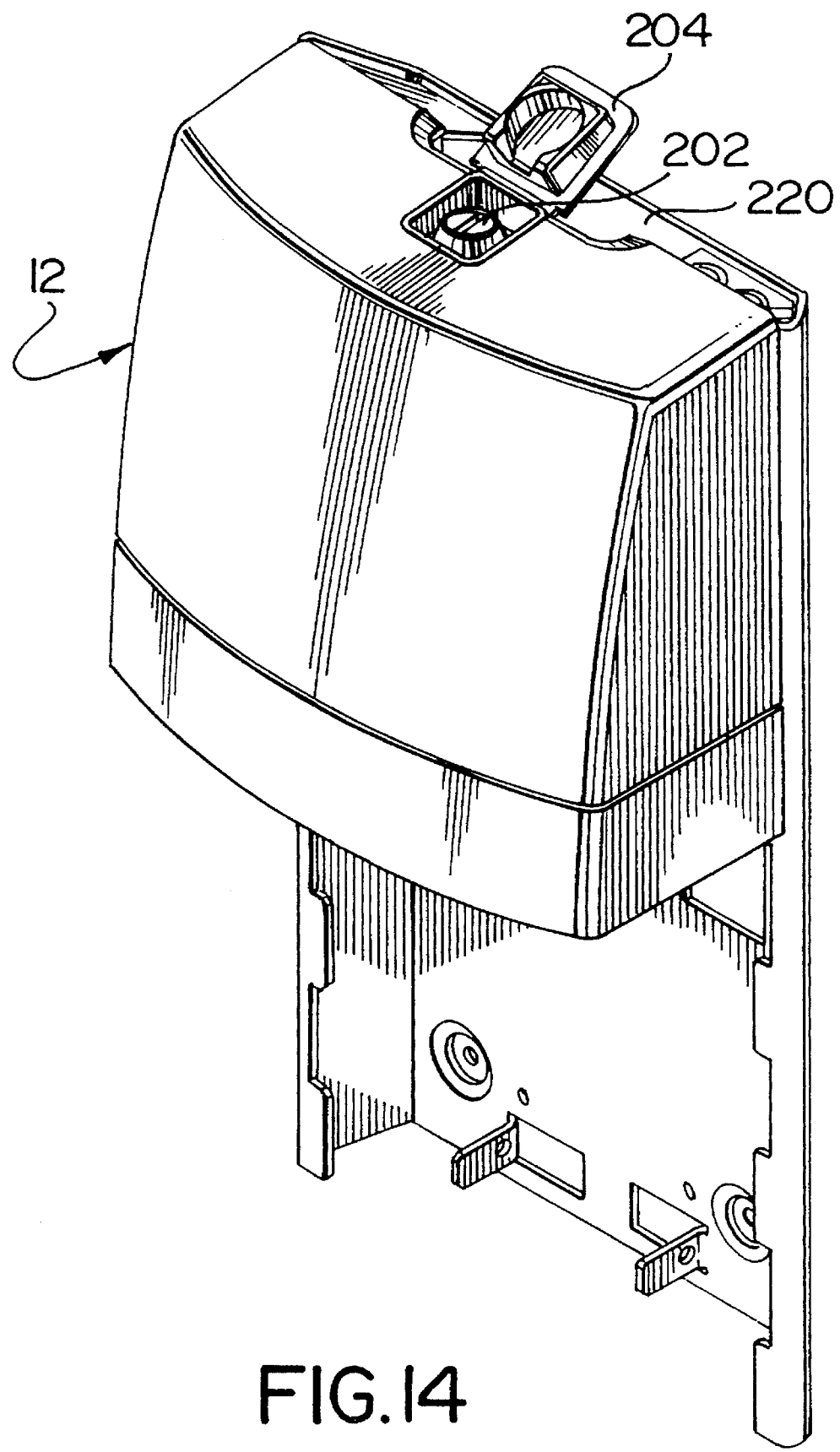
FIG. 14 is an isometric view of the completed interface module fitted to the support frame.

For installation purposes, the upper module 12 with cover removed is installed into the support frame 16 by movement of guide elements 183 between the projections 178 to align the projections with the guide slots 184. The module is then moved down with the projections in the guide slots to locate the module 12 in its mounting position. For this purpose stops are provided upon the support frame. These stops are formed as two forward extensions 194 of forwardly extending flanges 196 of the plate 170 of the support frame, upper edges of the projections 194 engaging the undersurface of the base 28 of the module 12. In this position (FIG. 13), which is the mounting position, two screws (not shown) are receivable through holes in the rear housing part 26 and lying in alignment with holes 198 formed in sideways extensions 200 of the flanges 196. The cover 24 of the upper module 12 is then secured in position and in that position as shown by FIG. 14, the lower part of the support frame is accessible for mounting of the module 14. The upper module has the cover 24 secured in position to prevent any premeditated damage to the internal equipment. For the purposes of securement, the upper module has a lock 202 (FIGS. 1 and 2) which is accessible in the top wall of the cover 24 by a pivoted flap 204 which serves as protection for the lock. Although not shown, the surfaces of the cover surrounding the lock 202 are sloped away from the lock and rearwardly so as to open through an aperture in the housing of the module 12 for run-off of moisture thereby resisting any tendency for the moisture to drain into the module itself. The module is operated by a key for moving a latch of the lock into and out of locking engagement with an appropriate slot 206 formed in a lock member 208 secured to the rear housing part 26 of the module (FIG. 13).

When it is required to add the module 14 so as to complete the assembly of the base station, the module 14 is located beneath module 12 and the guide elements 183 are moved through the appropriate slots 176 in the support frame and then upwardly to bring the module 14 into its mounting position. The appropriate connections have been previously made through the apertures 160 in the module 14 and as the module moves into its mounting position, latches 210 (FIG. 13) provided at the front of the base 28 of the module 12 pass through apertures 212 (FIG. 2) at the front edge of the top wall 32 of the module 14 to detachably retain the two modules together preparatory to securing the lower module in position. To secure the lower module in position, it is provided with two upward projections 214 formed as molded parts of the rear housing portion 32 (see particularly FIGS. 2 and 8) and these projections 214 move upwardly into a position in contact with and in front of further lateral extensions 216 (FIG. 12) of the flanges 196, the extensions 216 lying slightly below, parallel to, and rearwardly of the extensions 200. This rearward positioning of the flanges 216 is to accommodate the upward extensions 214 behind the rear housing part 26 of the upper module. With the cover 24 of the module 12 removed, further securing screws are then passed through the rear housing part 26 and through aligned holes in the extensions 214 and 216 to secure the lower module 14 in position. Removal of the module 14 may proceed in reverse manner without interfering with the electrical connections and equipment within the module 12.

As may be seen from the various figures, because of the shape of the support frame 16 and also of the rear wall 26 and the rear housing portion 32, a vertical space 220 is formed which extends for the whole depth of the base station and this space 220 acts as a heat removal chimney, as will now be described, for assisting in controlling the temperature within the module 14. In use, the base station has many features which contribute towards controlling its internal temperature and moisture content within desired limits so as to ensure that the internal electronic equipment is not deleteriously affected during usage. The features also ensure that condensation of moisture does not occur either widely upon electronic equipment or specifically in certain regions.

The main feature in this control is the provision of the rearward and forward air flow passages 56 and 58 together with the humidity control device 156. This is assisted to a large extent by the provision of the insulating air space 76. In essence therefore, in use of the device in any weather conditions, the circuit packs within the module 14 are constantly connected to the telecommunications circuit through the equipment in the module 12. Hence, heat is generated on a constant basis by electronic components of the circuit paths and without the air flow, overheating could take place resulting in damage to various of the electronic components. However, with the invention and as shown by the embodiment, the air in the forward air flow passage 58 becomes heated by the heat generated by the electronic components and as it is heated it flows upwardly by convection so as to pass through the space 60 beneath the top wall 38. Upon passing through this space it immediately contacts the rear wall 54 of the module, which is a heat conductive member, and proceeds to cool. As cooling proceeds the air at the top of the chamber 56 moves downwardly, heat being removed constantly during this process. Eventually this cooled air displaces the warmer air towards the lower end of the forward air flow passage 58 by movement through the air space 62. As a result, there is a constant circulation of air upwards in the passage 58 and downwards in the passage 56, the heat from the components moving into the air in passage 58 and being removed from the passage 56 through the rear wall 54 into the chimney provided by the vertical space 220. An upward convection current is created in the chimney for heat removal. It follows therefore that the constant removal of heat results. In addition to this, the air insulation space 76 acts as an insulation to protect the equipment rearwardly of the insulation space from heat transferred into the front wall 34 whereby heat radiated directly from the sun under tropical conditions does not reach the circuit packs significantly to affect the operation of the electronic equipment. Also, the ground planes which extend extensively throughout the printed circuit boards distribute the heat thereby avoiding the build-up of hot or cold spots on the boards. A more evenly distributed temperature is thus obtained throughout each board and circuit pack and this temperature is insufficient to result in damage to electronic equipment.

The design of the base station 10 is such that it is completely operational in outside temperatures between −50° C. and +50° C. without suffering damage to electronic components.

The combination of the insulated air space 76, the rearward and forward air flow passages 56 and 58, the relative positions of the circuit packs with the packs generating most heat being the lower packs, and heat distributing ground planes ensures that the temperatures of all electronic components are maintained within their operating temperature ranges. In addition, the temperature within module 14 is maintained at a desired temperature above the ambient temperature. This temperature differential is around 10° C., but could be higher or lower, the differential. being set to prevent condensation occurring, at any time, upon electronic components. Further, the humidity control device 156 is located at, or close to, the lower end of the rearward air flow passage 56 for the purpose of extracting moisture from the air as it is being cooled when flowing down passages 56. The humidity control device in this lower position also prevents accumulation of moisture within the bottom of module 14. The device 156 also operates to balance the moisture contents inside and outside the module 14. Further to this, of course, the ground plane in the circuit board 74 forms an electromagnetic shield between the antenna 78 and the circuit packs. This shield is assisted by the ground planes in the circuit boards of the circuit packs 64 and 66 which themselves lie forwardly of the electronic equipment extending rearwardly of the respective printed circuit boards.

Using the principles of the invention and particularly as shown by the described embodiment, it is possible to provide required temperatures within the module 14 to ensure that no damage caused by heat or cold can result to the equipment. Using the inventive features described above and, dependent upon the particular circumstances and the electronic components within a module, then temperatures can be controlled within the housing at the desired level above ambient temperature so as to prevent the build-up of condensation within the housing and also to maintain a desired temperature differential from ambient temperature with the higher temperature being within the housing. The parameters to obtain the desired result include the sizes of the forward and rearward air flow passages, the material of the housing of the module, and the size and shape of the insulation air space at the front of the housing. Further features which assist in control of the temperature relate to the fact that the module 12 is disposed above the module 14 and in direct adjacent relationship thereto so that it acts as an umbrella to the module 14 under any weather conditions. It thus prevents or resists to a great degree build-up of moisture upon the top of the module 14 and also protects the top of the module 14 from the effects of direct sunlight. In addition to this the module 12 prevents the sun shining directly into the top part of the chimney formed by the vertical space 220 so that the whole of this chimney is in shadow and effectively assists in cooling the module 14. As will be realized, sun is only capable of reaching the very top narrow regions of the chimney which lie at the top end of the module 12, these regions being extremely small vertically compared to the remainder of the chimney.

It is found that with the base station described in the embodiment a temperature control may be obtained which is constantly substantially 10° C. above ambient temperature even though ambient temperature may vary anywhere between −50° C. or +50° C. and also in hot sunny conditions in extremely hot climates. Only reasonable precautions should be considered in mounting locations for the base station of the embodiment. Heat trap locations or locations where there is a common occurrence of reflected solar radiation should be avoided. As may be seen, all of the above advantages are obtained merely by using the heat generated by the electronic components of the module 14, and the heat dissipation features of the construction. Use of ancillary heating or cooling equipment is therefore totally unnecessary while the constructions according to the invention and as described in the embodiment work efficiently and well under any adverse weather conditions.

What is claimed is:

1. A wireless base station for outdoor use comprising a housing having a front wall and a passive heat control comprising a heat conductive upwardly extending vertical rear wall, and an upwardly extending forward air flow passage interconnected for air circulation at upper and lower positions to an upwardly extending rearward air flow passage defined partly by the rear wall, and at least one circuit pack extending upwardly within the housing and having electronic components which extend into the forward air flow passage and in operation, generate heat and heat the forward air flow passage whereby heat circulates between the forward and rearward air flow passages to distribute heat and maintain desired operating temperatures of the electronic components, the air being heated flowing upwards in the forward air flow passage and downwards in the rearward air flow passage as heat is transferred to the rear wall.

2. A base station according to claim 1 including a radio antenna within the housing, at least a part of the housing provided as a non-electrically shielding material to permit communication between the antenna and a cordless wireless telephone handset.

3. A base station according to claim 2 wherein the housing is permeable to moisture and a humidity control device is included to provide a moisture balance between the inside and outside of the housing, the heat control being operable to provide and maintain desired temperatures within the housing above ambient temperatures so as to avoid internal condensation effects.

4. A base station according to claim 1 wherein the at least one circuit pack is disposed between the air flow passages and has its electronic components extending forwardly into the forward air flow passage which interconnects with the rearward air flow passage above and below the at least one circuit pack.

5. A base station according to claim 1 wherein the at least one circuit pack is disposed forwardly of the forward air flow passage and has its electronic components extending rearwardly into the forward air flow passage, and a vertical wall partition is disposed between the forward and rearward air flow passages, the forward and rearward air flow passages interconnecting above and below the vertical partition.

6. A base station according to claim 1 wherein the at least one circuit pack comprises a rear circuit pack disposed rearwardly of the forward air flow passage and has its electronic components extending forwardly into the forward air flow passage which interconnects with the rearward air flow passage above and below the at least one circuit pack, and a forward circuit pack is disposed forwardly of the forward air flow passage, the forward circuit pack having electronic components extending rearwardly for removal of heat into the forward air flow passage.

7. A base station according to claim 1 wherein, behind the front wall, there is disposed a vertical chamber isolating member which defines with the front wall an isolating air space which is substantially sealed from regions within the housing and rearwardly of the isolating member.

8. A base station according to claim 7 comprising a radio antenna mounted within the isolating air space, the front wall formed of a moisture permeable and non-electrically shielding material, an electromagnetic radiation shield is disposed behind the antenna and the at least one circuit pack, and a humidity control device is disposed at a lower end portion of the rearward air flow passage for providing a moisture balance between the inside and outside of the housing, the heat control being operable to provide and maintain desired temperatures within the housing above ambient temperatures so as to avoid internal condensation effects.

9. A base station according to claim 8 wherein the antenna is mounted upon the vertical chamber isolating member.

10. A base station according to claim 8 wherein the vertical chamber isolating chamber comprises an antenna printed circuit board and the shield comprises a ground plane of the antenna printed circuit board.

11. A base station according to claim 1 wherein the at least one circuit pack comprises at least one ground plane which is operable to distribute heat from regions of the board to which heat is conducted by electronic components thereby to avoid formation of hot or cold spots upon the circuit pack.

12. A base station according to claim 11 wherein the ground plane is substantially co-extensive with the printed circuit board of the circuit pack.

13. A base station according to claim 10 wherein the at least one circuit pack comprises a forward circuit pack disposed forwardly of the forward air flow passage, the forward circuit pack being spaced rearwardly of the antenna printed circuit board and having electronic components extending rearwardly for removal of heat from the components into the forward air flow passage, and a rear circuit pack is disposed rearwardly of and has its electronic components extending forwardly into the forward air flow passage which interconnects with the rearward air flow passage above and below the rear circuit pack.

14. A base station according to claim 1 comprising a radio transmitting and receiving module having the housing with the front and rear walls and the at least one circuit pack; and an interface module for connecting the transmitting and receiving module to a telecommunications circuit, the modules connectable together with the signal transmitting and receiving module disposed below the interface module so as to be afforded protection against ambient atmospheric conditions.

15. A base station according to claim 1 provided with a support means to mount the base station in a position spaced from a wall to create a convection chimney behind the base station.

16. A base station according to claim 1 wherein there is provided at least one insulating air space inwardly of side walls of the housing to insulate the at least one circuit pack from heat in the side walls.

* * * * *